US010694640B2

(12) United States Patent
Chen et al.

(10) Patent No.: US 10,694,640 B2
(45) Date of Patent: Jun. 23, 2020

(54) SERVER WATER COOLING MODULES PREVENT WATER LEAKAGE DEVICE

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Tsung-Ta Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/985,336

(22) Filed: May 21, 2018

(65) Prior Publication Data

US 2019/0239386 A1  Aug. 1, 2019

Related U.S. Application Data

(60) Provisional application No. 62/623,706, filed on Jan. 30, 2018.

(51) Int. Cl.
*H05K 7/20* (2006.01)

(52) U.S. Cl.
CPC ..... *H05K 7/20254* (2013.01); *H05K 7/20272* (2013.01); *H05K 7/20763* (2013.01); *H05K 7/20772* (2013.01)

(58) Field of Classification Search
CPC ........... H05K 7/20254; H05K 7/20836; H05K 7/20218; H05K 7/20272; H05K 7/20627–20645; H05K 7/20763–20781; H05K 7/20327; G06F 1/20; G06F 1/203; G06F 2200/201

USPC ........ 361/702, 679.46–679.48, 679.53, 699, 361/720; 165/80.4–80.5, 104.33; 257/714
See application file for complete search history.

(56) References Cited

U.S. PATENT DOCUMENTS 4,546,619 A * 10/1985 Rohner .............. H05K 7/20354
165/80.4
6,111,749 A * 8/2000 Lamb .................... H01L 23/473
361/699

(Continued)

FOREIGN PATENT DOCUMENTS

CN 202587734 U 12/2012
EP 3068205 A1 9/2016

(Continued)

OTHER PUBLICATIONS

Zhou, Zheming, English Translation of WO2013166933, published Nov. 14, 2013 (Year: 2013).*

(Continued)

*Primary Examiner* — Daniel P Wicklund
*Assistant Examiner* — Amir A Jalali
(74) *Attorney, Agent, or Firm* — Nixon Peabody LLP

(57) ABSTRACT

This disclosure relates to connecting a metal hose between a radiator and a cold plate that cools a CPU, or similar electronic heat generating component, whereby the metal hose is connected to the radiator with silicon casings. Waterproof spray plates are also provided to direct any water spray away from the electronic components. A water tray beneath the waterproof spray plates collects any water and directs it to a location outside the chassis.

10 Claims, 3 Drawing Sheets

(56) References Cited

U.S. PATENT DOCUMENTS

| | | | |
|---|---|---|---|
| 7,681,410 B1* | 3/2010 | Bean, Jr. | F25D 16/00 361/699 |
| 7,854,141 B1* | 12/2010 | Breen | F24F 1/022 62/272 |
| 2001/0036061 A1* | 11/2001 | Donahoe | G06F 1/203 361/679.46 |
| 2004/0188064 A1* | 9/2004 | Upadhya | F04B 17/00 165/80.3 |
| 2004/0250992 A1* | 12/2004 | Aoki | H05K 7/20727 165/80.3 |
| 2008/0164011 A1* | 7/2008 | Chen | F04D 13/12 165/104.33 |
| 2008/0276639 A1* | 11/2008 | Stoddard | G06F 1/20 62/259.2 |
| 2010/0050756 A1* | 3/2010 | Stewart | F24F 13/22 73/114.55 |
| 2010/0264647 A1 | 10/2010 | Gange et al. | |
| 2011/0313576 A1* | 12/2011 | Nicewonger | F28D 15/00 700/282 |
| 2012/0216903 A1 | 8/2012 | Osborne | |
| 2013/0233532 A1* | 9/2013 | Imwalle | F28F 27/02 165/287 |
| 2015/0131228 A1* | 5/2015 | Ishikawa | G01M 3/047 361/699 |
| 2016/0088768 A1* | 3/2016 | Wang | G06F 1/20 165/104.31 |
| 2016/0208967 A1 | 7/2016 | Krug, Jr. et al. | |
| 2016/0270267 A1* | 9/2016 | Chainer | H05K 7/20781 |
| 2016/0379852 A1* | 12/2016 | Tustaniwskyj | H01L 21/67109 165/296 |
| 2017/0367217 A1* | 12/2017 | Xiao | H05K 7/20272 |

FOREIGN PATENT DOCUMENTS

| | | |
|---|---|---|
| JP | 2003263244 A | 9/2003 |
| JP | 2005229038 A | 8/2005 |
| JP | 2015501480 A | 1/2015 |
| JP | 2016502714 A | 1/2016 |
| TW | 200913861 A | 3/2009 |
| WO | WO 2013/166933 A1 * 11/2014 | G06F 1/20 |

OTHER PUBLICATIONS

Extended European Search Report for EP Application No. 18187548.5, dated Jan. 31, 2019.
TW Office Action for Application No. 107122667, dated Apr. 24, 2019, w/ First Office Action Summary.
TW Search Report for Application No. 107122667, dated Apr. 24, 2019, w/ First Office Action.
JP Office Action for Application No. 2018-197318, dated Nov. 5, 2019, w/ First Office Action Summary.
JP Office Action for Application No. 2018-197318, dated Apr. 28, 2020, w/ Second Office Action Summary.

* cited by examiner

US 10,694,640 B2

SERVER WATER COOLING MODULES PREVENT WATER LEAKAGE DEVICE

CROSS REFERENCE TO RELATED APPLICATIONS

This application claims priority to and the benefit of U.S. Provisional Patent Application No. 62/623,706, entitled "SERVER WATER COOLING MODULES PREVENT WATER LEAKAGE DEVICE" and filed Jan. 30, 2018, the contents of which are herein incorporated by reference in their entirety as if fully set forth herein.

FIELD

This disclosure relates to connecting a metal hose between a radiator and a cold plate that cools a CPU, or similar electronic heat generating component, whereby the metal hose is connected to the radiator with silicon casings. Waterproof spray plates are also provided to direct any water spray away from the electronic components. A tray is positioned beneath the radiator to act as a catch basin for any leakage at the radiator/metal hose interface. The tray is shaped so as to divert any captured spray/water leakage away from the electronic components.

BACKGROUND

Current water cooling modules present in existing servers use silicon hoses to connect the radiator with the cold plate that cools the heat generating electronic component present in the server, such as a central processing unit ("CPU"). These current water cooling modules utilize a clip to affix the silicon hose to the radiator or cold plate. The use of the current clips with the silicon hose frequently causes water leakage or water spray at the joint, thereby resulting in damage to the heat generating electronic component. Thus, there is a need for a better system to prevent leaks or water spray, and to protect the electronic components within the server.

SUMMARY

The present disclosure can limit water leakage or water spray problem. According to one embodiment of this disclosure, the radiator and cold plate are connected by metal hoses, with the use of a silicon casing in proximity only at the connection of the metal hose to the radiator. Thus, there is only one area of the system that is amenable to water leakage or water spray.

Additionally, in order to prevent water flow into the chassis, a water proof spray plate is placed between the hose connection and the heat generating electronic components. Additionally, a water tray is provided beneath the radiator to collect any water leakage or water spray, and to then lead the water outside of the chassis.

These and other objects of the disclosure will be more readily understood when read in conjunction with the following detailed description and appended drawings.

DETAILED DESCRIPTION

Figure 1:
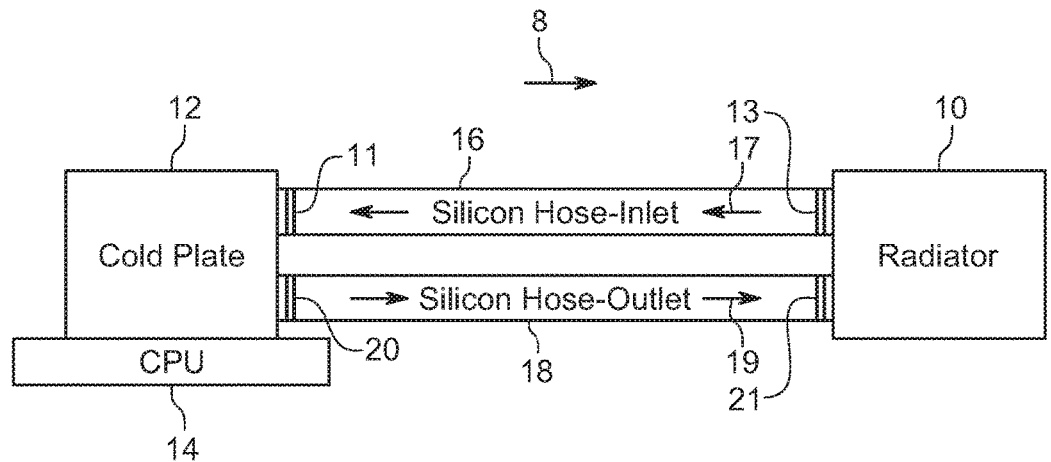
FIG. 1 (Prior Art) is a schematic, elevation view of a conventional cooling system including connections between a radiator and a cold plate, which cools a heat generating electronic component, such as a CPU.

The present invention is described with reference to the attached figures, wherein like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows a conventional configuration for a cooling system with connections between a radiator 10 and a cold plate 12. Cold plate 12 cools a heat generating electronic device, such as central processing unit 14. A cooling air stream or flow 8, in the direction of the arrow, flows across the cold plate 12 towards the radiator 10. Cold plate 12 is usually in direct contact with the heat generating electronic device 14, and cools the same by conduction between the electronic device 14 and cold plate 12. In the conventional configuration of FIG. 1, the connection between radiator 10 and cold plate 12 is made by silicon hoses 16, 18. The silicon hose 16 supplies coolant from the radiator 10 to the cold plate 12, while the silicon hose 18 returns heated coolant from the cold plate 12 to the radiator 10. Flow within the silicon hoses 16 and 18 is shown by arrows 17 and 19, respectively.

As can be seen in FIG. 1, clips 11, 13 are positioned near the respective connections of the silicon hose 16 with the cold plate 12 and the radiator 10. Similarly, clips 20 and 21 connect the ends of the silicon hose 18 to the cold plate 12 and the radiator 10. Leakage of coolant and/or water spray from any one of clips 11, 13, 20, 21 will impinge on CPU 14, or on the chassis 25 (in FIG. 3) upon which the CPU 14 sits.

Figure 2:
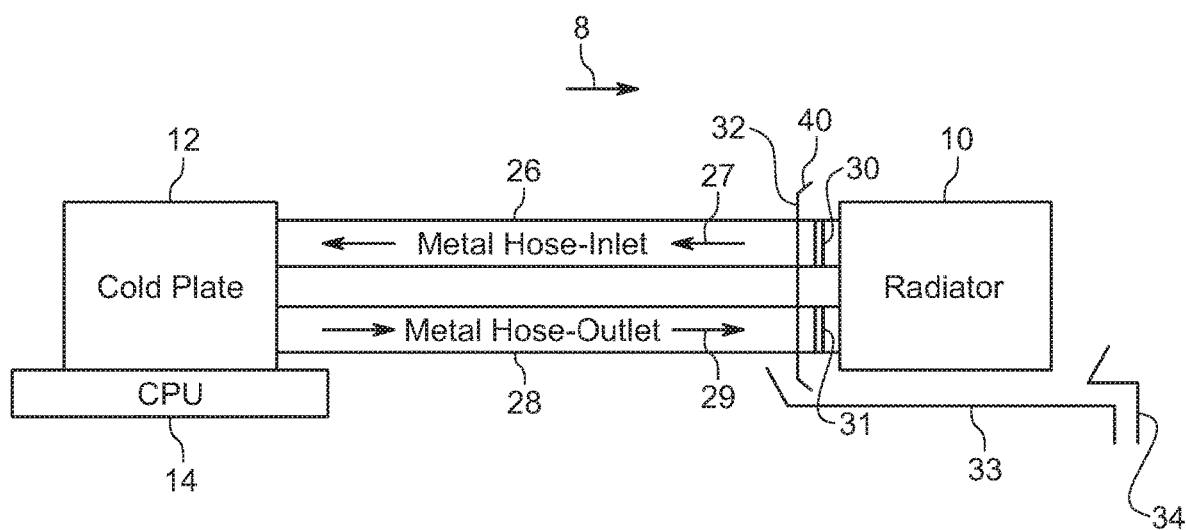
FIG. 2 is a schematic, elevation view of a system of connecting cooling hose between a radiator and a cold plate.

FIG. 2 illustrates the disclosure according to one embodiment. While the radiator 10, cold plate 12, and CPU 14 are similar to that shown in FIG. 1, metal hoses 26, 28 between radiator 10 and cold plate 12 are radically different. Each of the metal hoses 26, 28 are made of metal and are integrally formed to the cold plate. Such integration can take the form of soldering the metal hoses 26, 28 to the cold plate 12. Alternatively, cold plate 12 can initially be created with the metal hoses 26, 28 as part of an integral structure. Thus, only end 27 of the metal hose 26 and end 29 of the metal hose 28 need be connected to radiator 10. Such connections are made through the use of silicon casings, 30, 31 which fit over the metal hoses 26, 28, respectively, near their ends 27, 29, respectively, to connect the metal hoses 26, 28 to radiator 10.

The coolant contemplated for use in the system of this disclosure is water alone, but can be a solution of water containing dissolved salts or other elements to enhance the cooling effect.

It should be expressly understood that while applicants have illustrated the electronic heat generating unit as a CPU in FIGS. 1 and 2, the electronic heat generating component can be other than a CPU, such as a graphics processing unit ("GPU"). Also, more than one heat generating electronic component can be attached to radiator 10, such as the two heat generating units 8 and 14, as discussed below in further detail with respect to FIGS. 3-4.

Additionally, applicants provide a waterproof spray plate 32 which isolates radiator 10 (and specifically the connections of the metal hoses 26, 28) from the CPU 14. The waterproof spray plate 32 is formed with an upper end shaped to deflect any water spray away from the electronic component. This shape may comprise a reverse curved upper surface 40 to direct any water spray away from CPU 14.

In order to prevent any water leakage or water spray from the connections of the metal hoses 26, 28 to radiator 10 from reaching chassis 25, an additional water tray 33 is provided. Any water or water spray impinging upon waterproof spray plate 32 is thus collected by water tray 33, and directed outside the chassis 25 through conduit 34. The waterproof spray plate 32 and water tray 33 can be manufactured from suitable plastics and shaped by conventional manufacturing techniques, such as injection molding, casting, pressing, transfer molding, etc. Although plastics are preferred, the waterproof spray plate 32 and/or water tray 33 can also be formed of metal.

Figure 3:
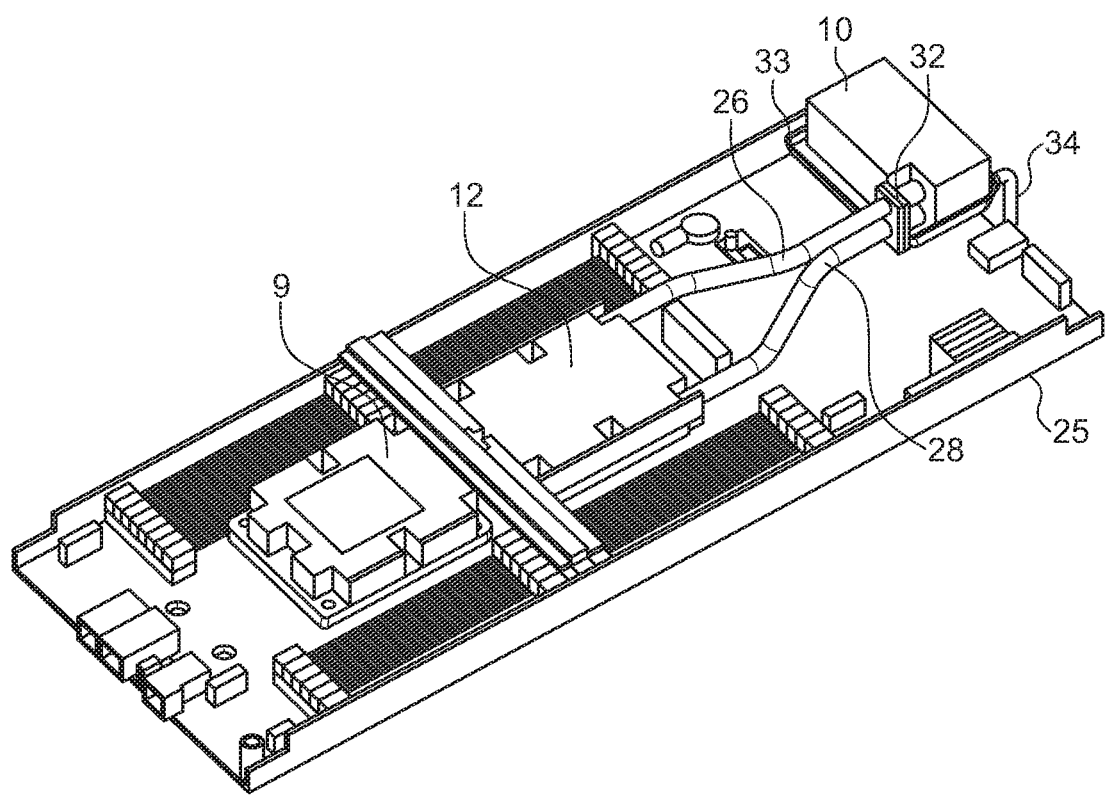
FIG. 3 is a schematic, perspective view of a system for preventing water leakage or water spray from damaging electronic components in a server.
Figure 4:
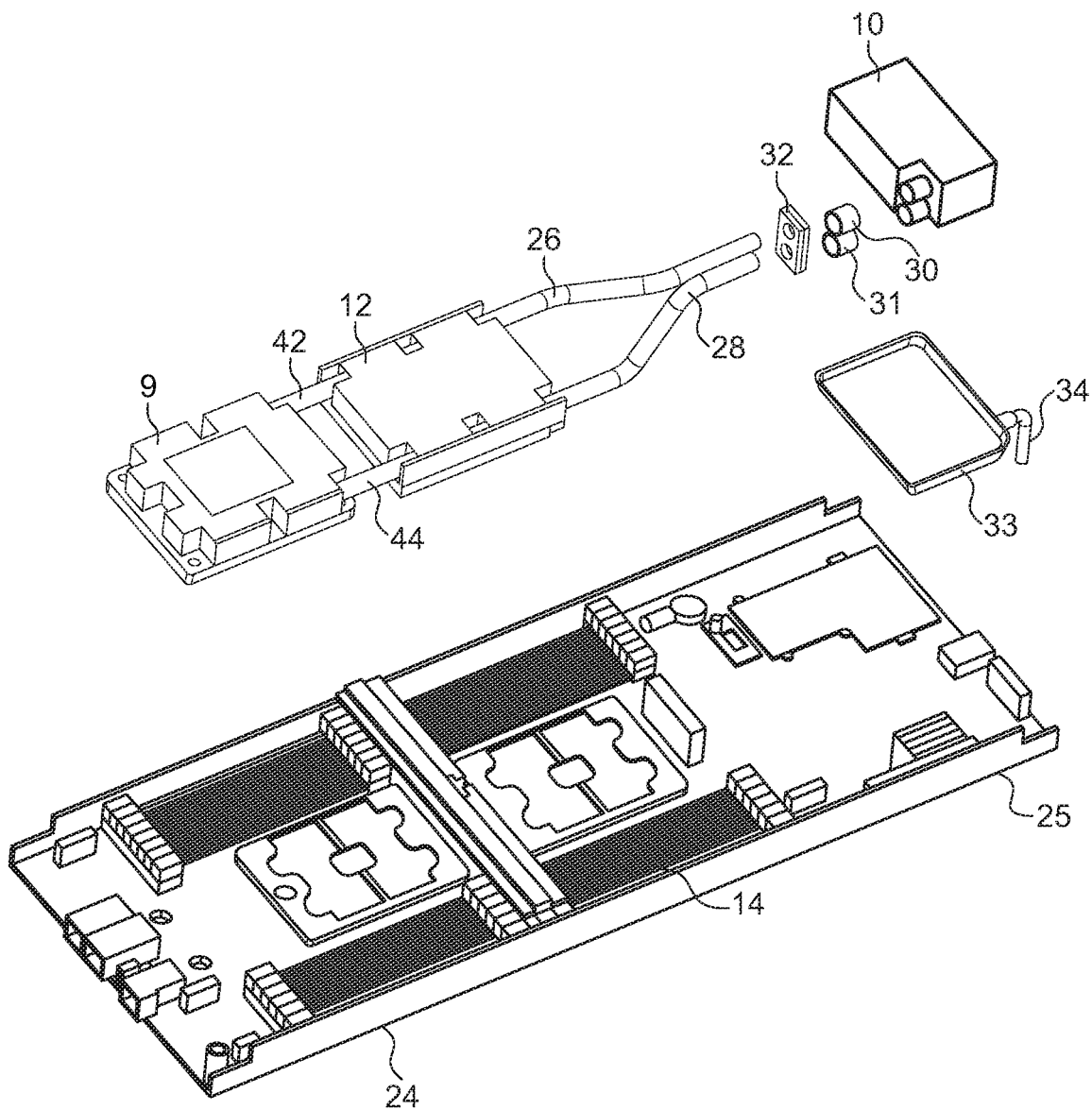
FIG. 4 is an exploded view of the components of FIG. 3.

The perspective view of FIG. 3 illustrates radiator 10 having the metal hoses 26, 28, to connect to cold plate 12. Waterproof spray plate 32 and water tray 33 are also illustrated. Conduit 34 is also clearly visible to convey any water in water tray 33 to exit outside of chassis 25. A second cold plate 9 can also be connected to radiator 10 in this view. In FIG. 4, metal hoses 42, 44, connecting cold plate 12 with cold plate 9, are integrally formed with the metal hoses 26, 28 thereby negating the possibility of leaks.

The exploded view of FIG. 4 illustrates each of the previously described elements more clearly, thereby facilitating not only the function of each element, but also their relative structural interrelationship to other elements of the system.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

We claim:

1. A cooling system for use in cooling heat-generating electronic components, the system comprising:

a radiator;

at least one cold plate for cooling a heat generating electronic component, the cold plate comprising integrally attached metal hoses for the passage of cooling fluid from the radiator, and the return of heated cooling fluid to the radiator, wherein the at least cold plate and the metal hoses are made of the same material and are integrated together in a form of soldering;

a silicon casing for connecting each of the metal hoses to the radiator;

a waterproof spray plate positioned between the heat generating electronic component and the silicon casings, the waterproof spray plate being configured to prevent liquid spray from the connection of the metal hoses to the radiator from reaching the heat generating electronic component; and a water tray positioned beneath the radiator and the waterproof spray plate, the waterproof spray plate being shaped to deflect liquid spray toward the water tray, the water tray being configured to collect liquid spray from the connection of the metal hoses and liquid spray deflecting off of the waterproof spray plate.

2. The cooling system of claim 1, further comprising an outlet to direct any water collected in the water tray away from a chassis containing the heat generating electronic component.

3. The cooling system of claim 1, further comprising at least a second cooling plate.

4. The cooling system of claim 1, wherein the heat generating electronic component is a central processing unit (CPU).

5. The cooling system of claim 1, wherein the cold plate is in contact with the heat generating electronic component.

6. The cooling system of claim 1, wherein the waterproof spray plate has a reverse curved upper surface to direct any water spray away from the heat generating electronic component and toward the water tray.

7. A server comprising the cooling system of claim 1.

8. A server containing at least one heat generating electronic component and comprising at least one cooling plate in contact with the heat generating electronic component, the server further comprising:

a radiator connected to the at least one cooling plate by a metal hose, the metal hose being integral with the cooling plate at one end, wherein the at least cooling plate and the metal hose are made of the same material and are integrated together in a form of soldering;

at another end, the metal hose being connected to the radiator by a silicon casing;

a waterproof spray plate positioned between the heat generating electronic component and the silicon casing, the waterproof spray plate being configured to prevent liquid spray from the connection of the metal hose to the radiator from reaching the heat generating electronic component; and a water tray positioned beneath the radiator and the waterproof spray plate, the waterproof spray plate being shaped to deflect liquid spray away from the heat generating electronic component and toward the water tray, the water tray being configured to collect liquid spray from the connection of the metal hoses and liquid spray deflecting off of the waterproof spray plate.

9. The server of claim 8, further comprising a chassis containing the heat generating electronic component, and further comprising an outlet for the water tray, the outlet being positioned to direct any water in the water tray away from the chassis.

10. A server system comprising:
- a server comprising at least one heat generating electronic component;
- a radiator;
- metal hoses connected to the radiator;
- a spray plate positioned between the radiator/metal hose connection and the at least one heat generating electronic component, the waterproof spray plate being configured to deflect liquid spray from the radiator/metal hose connection away from the at least one heat generating electronic component;
- at least one cold plate for cooling the at least one heat generating electronic component, the cold plate comprising integrally attached metal hoses for the passage of cooling fluid from the radiator, and the return of heated cooling fluid to the radiator, wherein the at least cold plate and the metal hoses are made of the same material and are integrated together in a form of soldering; and
- a water tray positioned beneath the radiator and the waterproof spray plate, the waterproof spray plate being shaped to deflect liquid spray away from the heat generating electronic component and toward the water tray, the water tray being configured to collect liquid spray from the connection of the metal hoses and liquid spray deflecting off of the waterproof spray plate.

* * * * *